(12) United States Patent
Scharnagl et al.

(10) Patent No.: US 8,853,094 B2
(45) Date of Patent: Oct. 7, 2014

(54) METHOD FOR MANUFACTURING A SEMICONDUCTOR STRUCTURE

(75) Inventors: Thomas Scharnagl, Tiefenbach (DE); Berthold Staufer, Moosburg (DE)

(73) Assignee: Texas Instruments Deutschland GmbH, Freising (DE)

( * ) Notice: Subject to any disclaimer, the term of this patent is extended or adjusted under 35 U.S.C. 154(b) by 148 days.

(21) Appl. No.: 13/401,537

(22) Filed: Feb. 21, 2012

(65) Prior Publication Data

US 2012/0214314 A1  Aug. 23, 2012

(30) Foreign Application Priority Data

Feb. 23, 2011  (DE) .......................... 10 2011 012 087

(51) Int. Cl.
| | | |
|---|---|---|
| *H01L 21/302* | (2006.01) | |
| *H01L 27/082* | (2006.01) | |
| *H01L 21/8228* | (2006.01) | |
| *H01L 29/66* | (2006.01) | |

(52) U.S. Cl.
CPC ........ *H01L 29/66272* (2013.01); *H01L 27/082* (2013.01); *H01L 21/8228* (2013.01)
USPC ............................. 438/712; 438/723; 438/743

(58) Field of Classification Search
CPC ..................... H01L 21/3065; H01L 21/31116; H01L 21/32136; H01L 21/8228
USPC .......................................... 438/712, 723, 743
See application file for complete search history.

(56) References Cited

U.S. PATENT DOCUMENTS

| | | | |
|---|---|---|---|
| 4,583,106 A | | 4/1986 | Anantha et al. |
| 4,876,217 A | * | 10/1989 | Zdebel ........................ 438/430 |
| 6,797,580 B1 | | 9/2004 | Yin et al. |
| 2006/0110928 A1 | * | 5/2006 | Degroote ..................... 438/719 |
| 2007/0037395 A1 | | 2/2007 | Beachy et al. |
| 2009/0029293 A1 | * | 1/2009 | Watanabe ..................... 430/312 |
| 2010/0273301 A1 | * | 10/2010 | Nanda et al. .................. 438/207 |

FOREIGN PATENT DOCUMENTS

DE  103 58 047  6/2005

* cited by examiner

*Primary Examiner* — Binh X Tran
(74) *Attorney, Agent, or Firm* — Jacqueline J. Garner; Frederick J. Telecky, Jr.; Wolfram Tietscher

(57) ABSTRACT

A method for manufacturing a semiconductor structure comprising complementary bipolar transistors, wherein for manufacture of a PNP-type structure, an emitter layer having a surface oxide layer is present on top of an NPN-type structure, the emitter layer comprising lateral and vertical surfaces, and wherein for removal of the oxide layer, an ion etching step is applied, wherein for the on etching step a plasma for providing ions is generated in a vacuum chamber by RF coupling and the generated ions are accelerated by an acceleration voltage between the plasma and a wafer comprising the semiconductor structure, and wherein the plasma generation and the ion acceleration are controlled independently from each other.

16 Claims, 2 Drawing Sheets

METHOD FOR MANUFACTURING A SEMICONDUCTOR STRUCTURE

FIELD OF THE INVENTION

The invention relates to a method for manufacturing a semiconductor structure comprising complementary bipolar transistors.

BACKGROUND

In a sequence of a BICOM (or complementary bipolar) fabricating process with separated emitters, a PNP-type semiconductor structure is manufactured while an NPN-type semiconductor structure is already present on the wafer. The NPN-type structure, especially the NPN-emitter provides a surface topography having flat surfaces as well as vertical surfaces. During production of a p-emitter of the PNP-type semiconductor structure, a P-doped poly silicon layer is deposited on top of the aforementioned topography. This p-emitter layer comprises an oxide layer typically of $SiO_2$ that has to be removed during further steps of the semiconductor production process.

FIG. 1 illustrates a typical situation during a BICOM process, wherein p-emitter poly silicon (Pemit Poly) is deposited on top of a first oxide layer (Oxide 1) of an NPN-type emitter (NPN-Emitter) of the earlier deposited NPN-type semiconductor structure. The P-emitter structure itself comprises a second surface oxide layer (Oxide 2) having a bottom antireflective coating (BARC) on top. According to the prior art, in a P-emitter poly etching step, the P-emitter poly layer (Pemit poly) and the second oxide layer (Oxide 2) are removed in a P-emitter poly etching step and parts of the wafer that are not covered by a respective resist are laid open. Especially, the already manufactured NPN-emitter has to lay open after this etching process. It is a task of the respective P-emitter poly etching process that the poly silicon layer (Pemit Poly) and the second oxide layer (Oxide 2) are removed residue-free. According to the prior art, after a BARC-etching step, the P-emitter poly layer (Pemit Poly) is removed in a wet chemical process that is however not preferable for small structures since the resist may lift-off and semiconductor structures that should be protected by the respective resist may be destroyed.

A second process that is known in the prior art is to remove the second oxide layer (Oxide 2) by an oxide plasma etching process. A typical resulting semiconductor structure is shown in FIG. 2. However, since the oxide plasma etching process which is a type of ion etching process has a strong anisotropic behavior, lateral surfaces are removed very quickly while vertical surfaces remain. Accordingly, there is an oxide residue 4, which is a part of the second oxide layer (Oxide 2) that is not removed during this process.

This oxide residue 4 causes that during removal of the P-emitter poly silicon (Pemit Poly) a poly stringer 6 remains (see FIG. 3). These poly stringers 6 cause leakage currents or may even lift off and float over the wafer and are therefore undesired.

SUMMARY

It is an object of the invention to provide a method for manufacturing a semiconductor structure comprising complementary bipolar transistors wherein the problem of remaining poly stringers is minimized.

In an aspect of the invention, a method for manufacturing a semiconductor structure comprising complementary bipolar transistors is provided. For manufacture of a PNP-type structure, an emitter layer having a surface oxide layer is present on top of an NPN-type semiconductor structure. The emitter layer comprises lateral and vertical surfaces and wherein for removal of the oxide layer an ion etching step is applied. For the ion etching step according to an aspect of the invention, a plasma for providing ions is generated in a vacuum chamber by RF coupling. The generated ions are accelerated by an acceleration voltage between the plasma and a wafer comprising the semiconductor structure. The plasma generation and the ion acceleration are controlled independently from each other.

Advantageously, the method according to the invention allows a residue-free removal of the oxide layer. Preferably at vertical steps, there is no leftover of the oxide layer and accordingly the development of poly stringers of the subjacent poly silicon layer during a sequent processing step is minimized.

According to a preferable embodiment of the invention, a process pressure and the acceleration voltage are defined so as to set an anisotropy of the ion etching process to a value that is lower than 50%. According to known anisotropic ion etching processes, a portion of the oxide layer that is adjacent to vertical surfaces of the semiconductor structure is solely removed from its lateral surface, i.e. from its top side. The removal of these oxide portions on the one hand demands for a very high etching time leading to over-etching of the lateral parts of the semiconductor structure on the other hand. It has been recognized that this oxide residues have to be attacked also from their vertical side surfaces and accordingly a more isotropic etching process is advantageous. However, according to empirical analysis it was found that an anisotropy of less than 50% is sufficient which means that the process has half the speed in a lateral direction compared to a vertical etching rate.

According to the prior art, the chemically very stable $SiO_2$ is removed by ion etching or ion-assisted plasma etching. The assistance of the kinetic energy of the high-energy ions is regarded as necessary in order to break up the molecular bindings at the surface of the $SiO_2$ layer. However, the ion etching processes known in the prior art have a strong anisotropy which means that only the lateral surfaces are attacked with a high etching rate. In contrast, according to an aspect of the invention, the elevated process pressure reduces the isotropy of the ion etching process to a value that is lower than 50%. Thereby the oxide residues are also attacked from their vertical surfaces and are removed residue-free.

According to another aspect of the invention, the on etching step is performed using a process pressure that is set to a value for which a mean free path of the accelerated ions is lower than a distance between the plasma and the wafer. Due to empirical analysis, it was found that a pressure between 10 mTorr and 30 mTorr, preferably 20 mTorr is advantageous. The distance between the wafer and the plasma is typically in the cm-range. The aforementioned pressure causes a mean free path that is in the mm-range.

Accordingly, this mean free path is lower than an average distance that the accelerated ions are travelling between the plasma and the surface of the wafer. As an average value, every on takes part in at least one collision event with a particle of the process gas. This scattering process lowers the anisotropy of the ion etching process and produces kinetic ions that attack the oxide residues also from their vertical surface.

According to an embodiment of the invention, the acceleration voltage of the ion etching equipment is set to zero. This is counterintuitive because it is well-established in the prior art that $SiO_2$-surface layers may only be removed with reasonable etching rates if the etching process is assisted by a high-speed ion bombardment. However, it was found that the oxide layer is also removed with zero acceleration voltage.

For increasing the etching rates, according to another embodiment, a generation of the plasma is performed with an RF-power of more than 350 W, preferably using an RF-power of 600 W. The RF-power is selected as high as possible, but limited by the wafer temperature, where the resist starts to flow since there is preferably no wafer cooling. This high RF-power causes a high plasma density and leads to reasonable etching rates while a strong anisotropy of the etching process may be avoided. This leads to a preferable processing time that is lower than 90 s preferably lower than 60 s.

According to another aspect of the invention, an etching gas is used during the process which causes no polymerization. Preferably an etching gas that is free from $CHF_3$ is applied. According to the standard oxide layer etching process known in the prior art, $CHF_3$ is applied as a process gas in order to increase the selectivity of the etching process with respect to silicon. $CHF_3$ however tends to polymerization. Again, it is counterintuitive to the technical knowledge in the prior art that this process gas is avoided according to an embodiment of the invention. It was found in empirical analysis that vertical surfaces of the semiconductor structure are coated with a polymer layer and accordingly oxide residues are also covered and protected by this polymer layer. This avoids an effective attack of these oxide residues by the etching process.

In another aspect of the invention, oxygen ($O_2$) is added to the etching gas which is preferably $C_2F_6$. The addition of oxygen causes a high concentration of fluorine radicals since the carbon in the etching gas is oxidized to CO and $CO_2$. This increases the reactivity of the etching process with respect to the silicon dioxide.

According to another embodiment of the invention, no wafer cooling is applied during the ion etching step and a wafer temperature of more than 40° C. is accepted. In contrast to the established processes, the usually applied wafer cooling that is typically performed by helium is switched off in the process according to the aforementioned embodiment. This is advantageous because an increased substrate temperature avoids a condensation of etching gas molecules on the surface of the semiconductor structure.

BRIEF DESCRIPTION OF DRAWINGS

Further aspects and characteristics of the invention will ensue from the following description of an example embodiment of the invention with reference to the accompanying drawings, wherein.

DETAILED DESCRIPTION OF AN EXAMPLE EMBODIMENT

Figure 1:
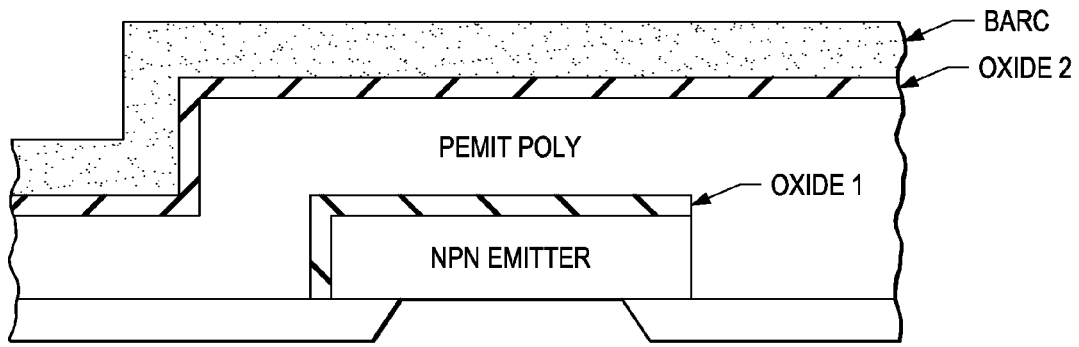
FIGS. 1 to 3 are simplified cross-sectional views of a semiconductor structure according to the prior art.
Figure 2:
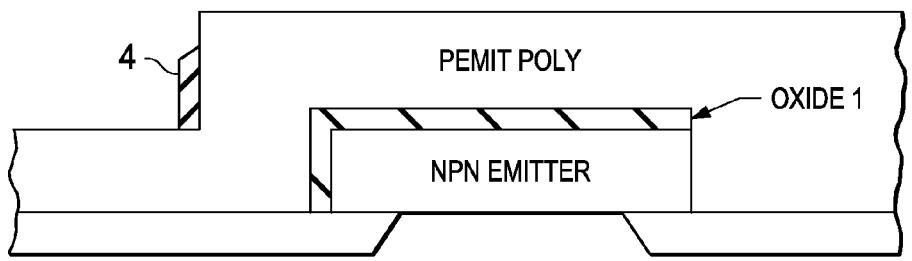
Figure 3:
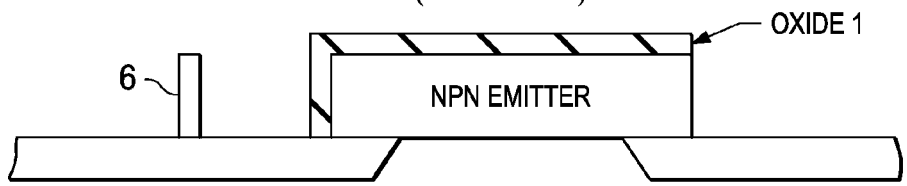

FIG. 1 illustrates a typical situation during a BICOM process, wherein p-emitter poly silicon (Pemit Poly) is deposited on top of a first oxide layer (Oxide 1) of an NPN-type emitter (NPN-Emitter) of the earlier deposited NPN-type semiconductor structure. The P-emitter structure itself comprises a second surface oxide layer (Oxide 2) having a bottom antireflective coating (BARC) on top. After the BARC removal, the second oxide surface layer (Oxide 2) has to be removed.

According to an embodiment, an oxide layer etching process is performed by using etching equipment, e.g. the LAM TCP9400 which is normally applied for anisotropic ion etching as for Gate Poly. However, the equipment allows an independent control of the ion acceleration and the plasma generation. In other words, the plasma generation and the ion acceleration are decoupled. A plasma for providing ions is generated in a vacuum chamber by RF coupling. Further, the ion acceleration that is mainly due to a bias power which is an RF-frequency that is applied to the chuck carrying the wafer, is set to a low value or is even completely switched off. Accordingly, the anisotropic etching characteristic of the ion etching equipment (that is typically due to the applied voltage for accelerating the ions from the plasma to the chuck) is lowered. Due to the switched-off bias power, the ions are scattered at the process gas molecules at a process pressure of preferably 20 mTorr. This process pressure is advantageous because with smaller process pressures a mean free path of the ions is comparable to the distance between the plasma and the surface of the semiconductor structure. Accordingly, only few scattering process are taking place. This would not significantly reduce the anisotropic characteristic of the ion etching process. However, with a higher process pressure, there will be a high number of scattering processes and a high loss of ions. This would reduce the etching rate significantly.

In order to achieve a reasonable etching rate, a high plasma density is generated by using a high RF-power. Typically a power more than 350 W which is a commonly used parameter for the aforementioned ion etching equipment is set to 600 W which is about twice the power. The high RF power together with the optimized process pressure and an optimized process gas (to which we will refer later) lead to reasonable etching rates, an anisotropy of about 50% or less and reasonable process times of less than 90 s, preferably of less than 60 s.

The process gas is optimized in that no process gas that causes polymerization is applied. According to the prior art. $CHF_3$ is applied as a process gas (that however causes polymerization). According to an advantageous embodiment, $C_2F_6$ and $O_2$ are used as process gases wherein the oxygen avoids a polymerization of the $C_2F_6$. This is due to the fact that a starting polymerization is avoided by oxidation of the respective constituent parts of the $C_2F_6$. In contrast, the decay of the $C_2F_6$ liberates fluorine radicals that increase the etching rate significantly.

Advantageously, the wafer cooling which is usually performed by providing helium to the wafer backside is switched off. Due to the impact of high speed ions, an elevated wafer temperature is achieved that is higher than the normally desired 40° C. A preferable wafer temperature of 60° C. to 80° C. avoids the condensation of the processing gas and therefore allows an etching attack to the vertical surface of the oxide residues too.

In another aspect, the oxide layer thickness may be reduced in order to avoid an undue high loss of resist. This allows an optimization of the overall process.

Figure 4:
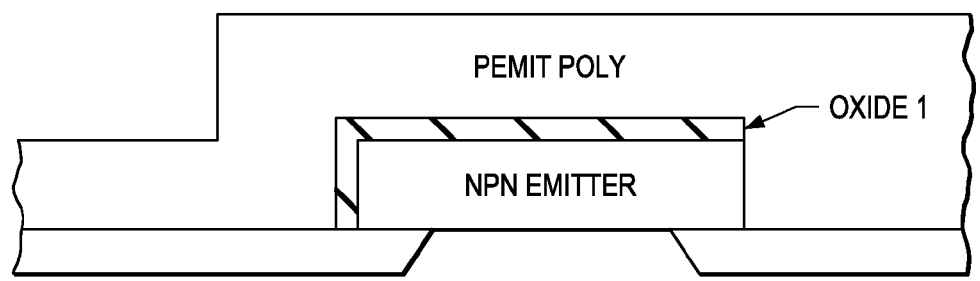
FIG. 4 shows a simplified cross-sectional view for a semiconductor structure after an oxide layer etching process according to an embodiment of the invention and FIG. 5 shows this cross-sectional view after removal of the P-emitter poly silicon.
Figure 5:
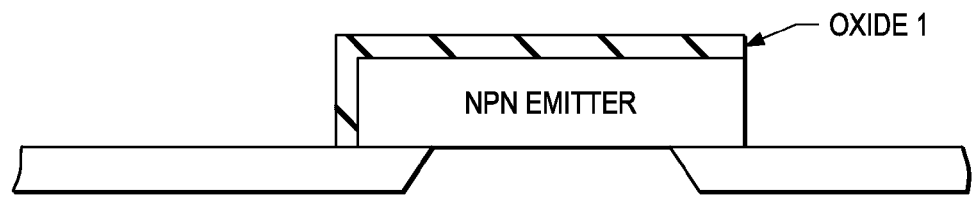

The aforementioned embodiment is illustrated by making reference to FIGS. 4 and 5 showing a simplified cross-sectional view to a semiconductor structure, wherein the second oxide layer (Oxide 2, see also FIG. 1) has been removed completely. No oxide residues are present. It shall be noted that the process pertains to the removal of the oxide layer only, removal of the basic antireflective coating (BARC) is performed in advance. In a further processing step, the result of which is shown in FIG. 5, the P-emitter poly silicon (Pemit Poly) is removed and due to the fact no oxide residues are present at the vertical surfaces, no poly stringers are present. Advantageously, a wet chemical process is avoided and the known problems of over-etching, delamination or lift-off of the resist—due to the small structures—may be avoided.

Although the invention has been described hereinabove with reference to a specific embodiment, it is not limited to this embodiment and no doubt further alternatives will occur to the skilled person that lie within the scope of the invention as claimed.

The invention claimed is:

1. A method for manufacturing a semiconductor structure comprising complementary bipolar transistors, comprising the step of manufacturing of a PNP-type structure by:

forming a p-emitter layer having an overlying surface oxide layer on top of an NPN-type structure including a NPN-emitter, the p-emitter layer comprising lateral and vertical surfaces; and removing the surface oxide layer using an ion etching step, wherein the ion etching step uses a plasma for providing ions wherein the plasma is generated in a vacuum chamber by RF coupling and the generated ions are accelerated by an acceleration voltage between the plasma and a wafer comprising the semiconductor structure, and wherein the plasma generation and the ion acceleration are controlled independently from each other.

2. The method according to claim 1, wherein a process pressure and the acceleration voltage are defined so as to set an anisotropy of the ion etching process to a value that is lower than 50%.

3. The method according to claim 1, wherein for generation of the plasma, an RF-power of more than 350 W is applied.

4. The method according to claim 1, wherein a processing time for the ion etching step is lower than 90 s.

5. The method according to claim 1, wherein no wafer cooling is applied during the ion etching step.

6. The method according to claim 1, wherein for generation of the plasma, an RF-power of 600 W is applied.

7. The method according to claim 1, wherein a processing time for the ion etching step is lower than 60 s.

8. The method according to claim 1, wherein an etching gas that is free from $CHF_3$ is applied.

9. The method according to claim 1, wherein a wafer temperature of more than 40° C. is applied.

10. The method according to claim 1, wherein for the ion etching step, a process pressure is set to a value for which a mean free path of the accelerated ions is lower than a distance between the plasma and the wafer.

11. The method of claim 10, wherein the process pressure is set to a value between 10 and 30 mTorr.

12. The method of claim 10, wherein the process pressure is set to a value of 20 mTorr.

13. The method according to claim 1, wherein the acceleration voltage is set to a value that is insufficient for sputtering of the oxide layer.

14. The method according to claim 13, wherein the acceleration voltage is set to zero.

15. The method according to claim 1, wherein an etching gas causing no polymerization thereof is applied.

16. The method according to claim 15, wherein $O_2$ is added to the etching gas, and $C_2F_6$ is applied as the etching gas.

* * * * *